(12) United States Patent
Park

(10) Patent No.: US 12,295,146 B2
(45) Date of Patent: May 6, 2025

(54) SELECTION DEVICE AND MEMORY DEVICE USING THE SAME

(71) Applicant: IUCF-HYU (Industry-University Cooperation Foundation Hanyang University), Seoul (KR)

(72) Inventor: Jea Gun Park, Seongnam-si (KR)

(73) Assignee: IUCF-HYU (INDUSTRY-UNIVERSITY COOPERATION FOUNDATION HANYANG UNIVERSITY), Seoul (KR)

(*) Notice: Subject to any disclaimer, the term of this patent is extended or adjusted under 35 U.S.C. 154(b) by 623 days.

(21) Appl. No.: 17/416,618

(22) PCT Filed: Nov. 7, 2019

(86) PCT No.: PCT/KR2019/015033
§ 371 (c)(1),
(2) Date: Jun. 21, 2021

(87) PCT Pub. No.: WO2020/130343
PCT Pub. Date: Jun. 25, 2020

(65) Prior Publication Data
US 2022/0085104 A1    Mar. 17, 2022

(30) Foreign Application Priority Data
Dec. 19, 2018 (KR) .................. 10-2018-0165693

(51) Int. Cl.
*H01L 27/24* (2006.01)
*H10B 61/00* (2023.01)
*H10B 63/00* (2023.01)

(52) U.S. Cl.
CPC ............. *H10B 63/20* (2023.02); *H10B 61/10* (2023.02)

(58) Field of Classification Search
CPC ................................ H10B 63/20; H10B 61/10
(Continued)

(56) References Cited

U.S. PATENT DOCUMENTS

| | | | |
|---|---|---|---|
| 2004/0192006 A1* | 9/2004 | Campbell | H10N 70/8825 257/E45.002 |
| 2012/0018695 A1* | 1/2012 | Lee | H10N 70/8833 257/4 |

(Continued)

FOREIGN PATENT DOCUMENTS

| | | |
|---|---|---|
| KR | 10-2006-0132038 A | 12/2006 |
| KR | 10-2012-0137862 A | 12/2012 |

(Continued)

OTHER PUBLICATIONS

Korea Intellectual Property Office Grant of Patent for KR 10-2018-0165693 dated Aug. 16, 2019.
(Continued)

*Primary Examiner* — Dzung Tran
(74) *Attorney, Agent, or Firm* — Sughrue Mion, PLLC

(57) ABSTRACT

The present invention discloses a selection device and a memory device including the same. The selection device according to an embodiment of the present invention has high reliability and a high selection ratio. Accordingly, when the selection device is used, a highly integrated memory cell capable of selecting a desired cell without leakage current may be provided.

8 Claims, 12 Drawing Sheets

(58) Field of Classification Search
USPC .............................................................. 257/5
See application file for complete search history.

(56) References Cited

U.S. PATENT DOCUMENTS

| | | | |
|---|---|---|---|
| 2014/0042380 A1* | 2/2014 | Kim | H10N 70/24 |
| | | | 257/2 |
| 2015/0028284 A1* | 1/2015 | Gotti | H10N 70/8828 |
| | | | 257/5 |
| 2016/0020252 A1* | 1/2016 | Lee | H10N 70/826 |
| | | | 257/4 |
| 2017/0213958 A1* | 7/2017 | Kim | H10N 70/826 |
| 2018/0040669 A1* | 2/2018 | Wu | H10N 70/24 |
| 2018/0061888 A1* | 3/2018 | Kwon | H10N 70/801 |

FOREIGN PATENT DOCUMENTS

| | | |
|---|---|---|
| KR | 10-2014-0021795 A | 2/2014 |
| KR | 10-2015-0043131 A | 4/2015 |
| KR | 10-2018-0015402 A | 2/2018 |
| KR | 10-2018-0051286 A | 5/2018 |

OTHER PUBLICATIONS

International Search Report for PCT/KR2019/015033 dated Feb. 11, 2020 [PCT/ISA/210].

* cited by examiner

【FIG. 1】
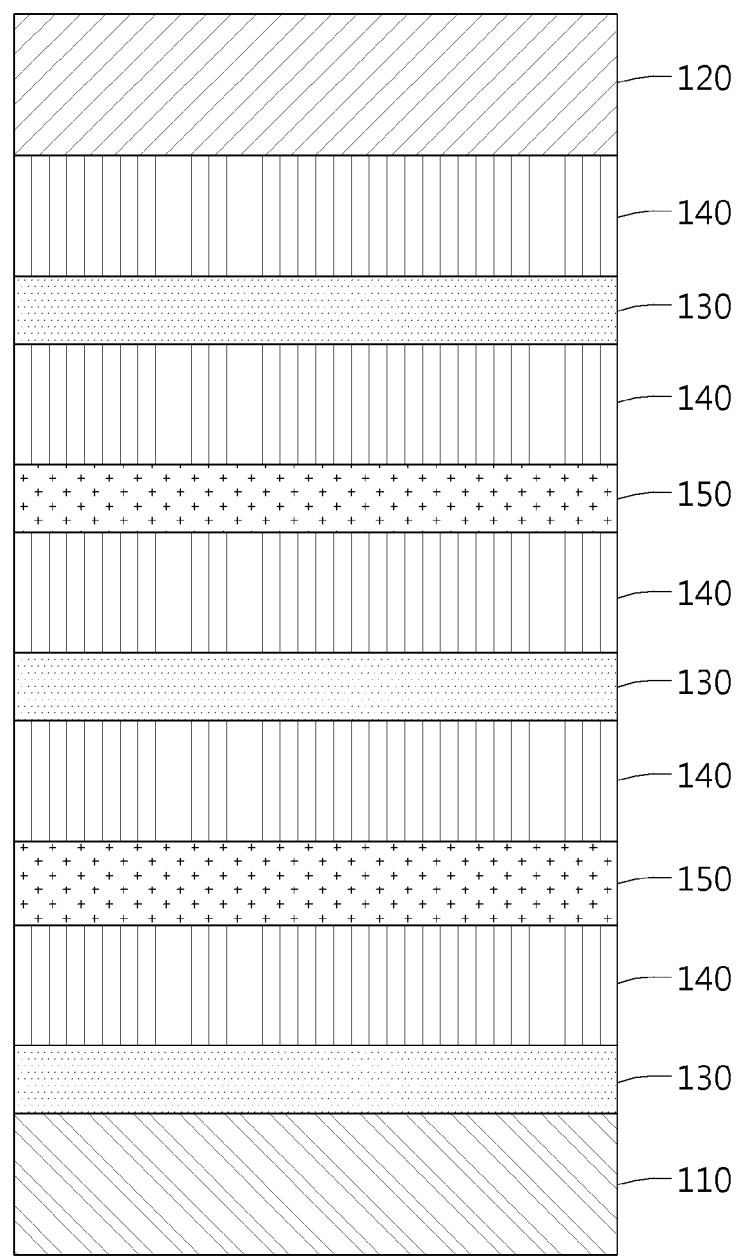

[FIG. 2]
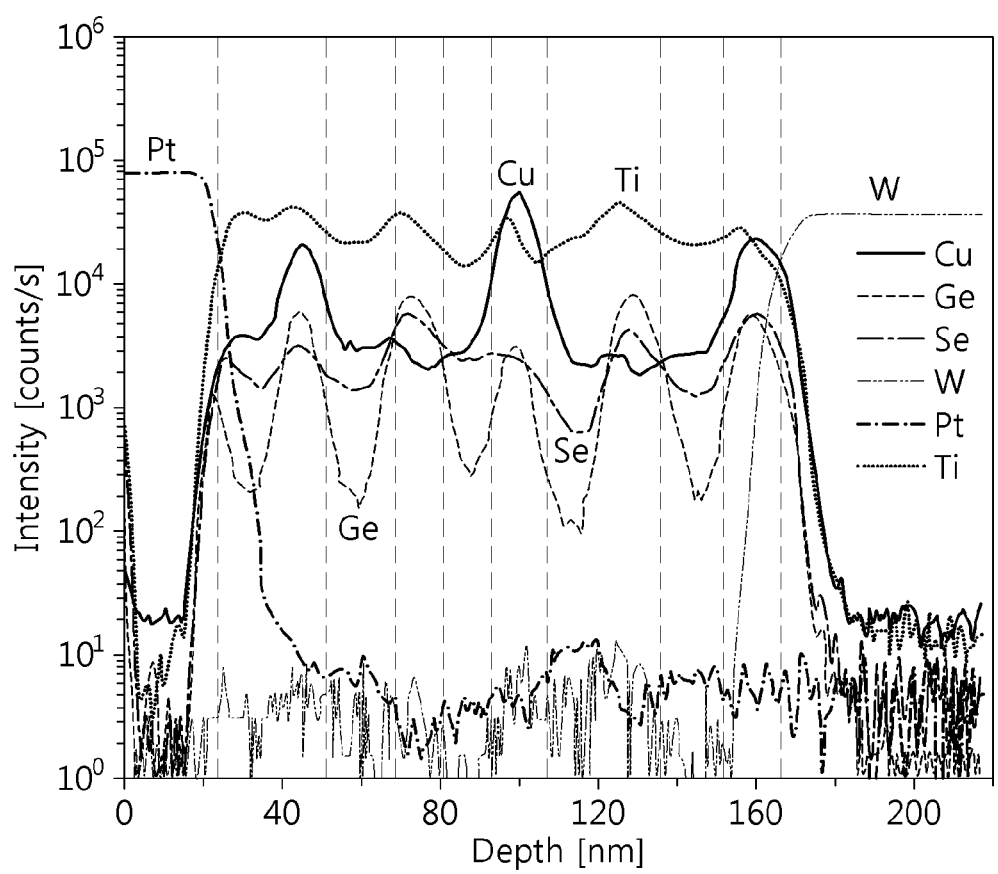

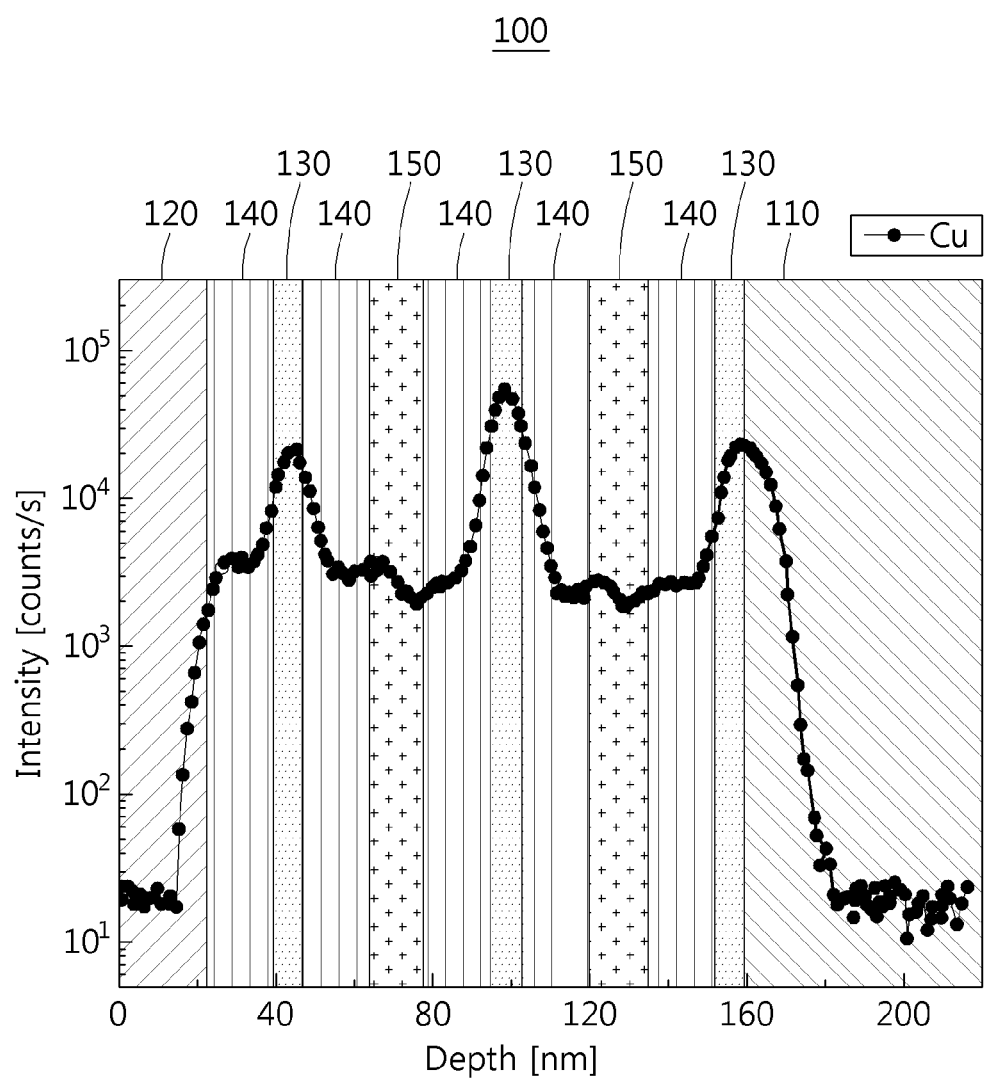
[FIG. 3]

[FIG. 4]
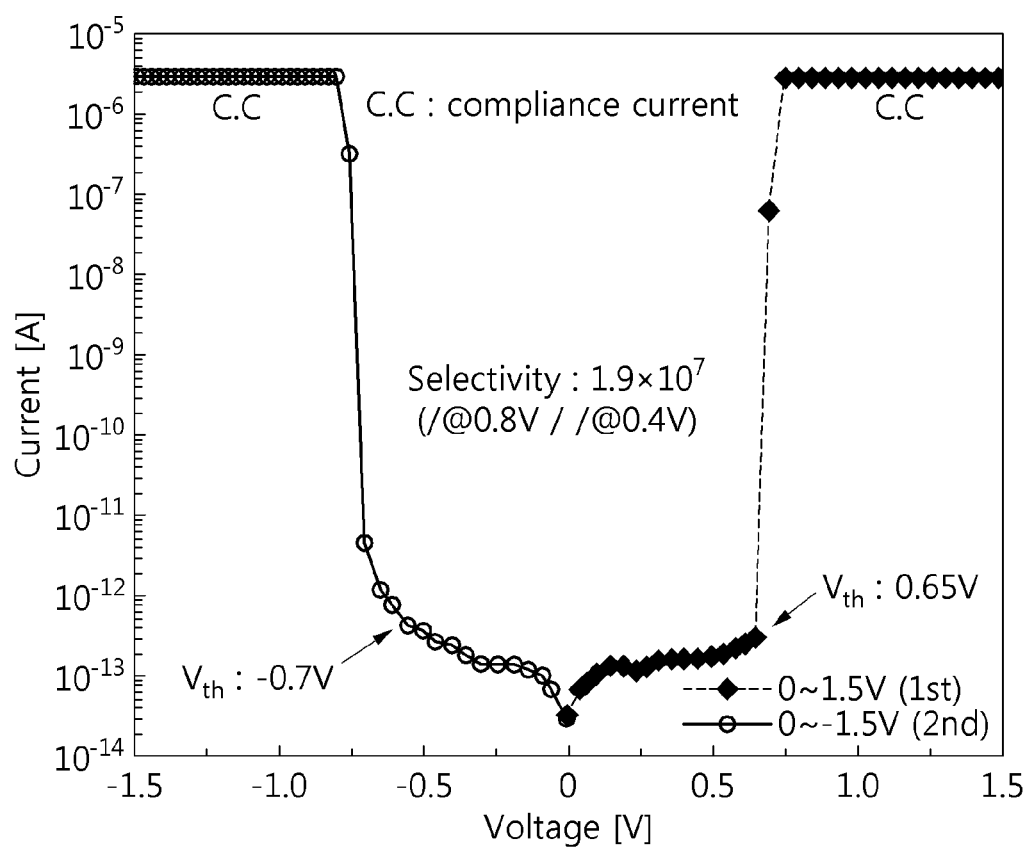

[FIG. 5A]
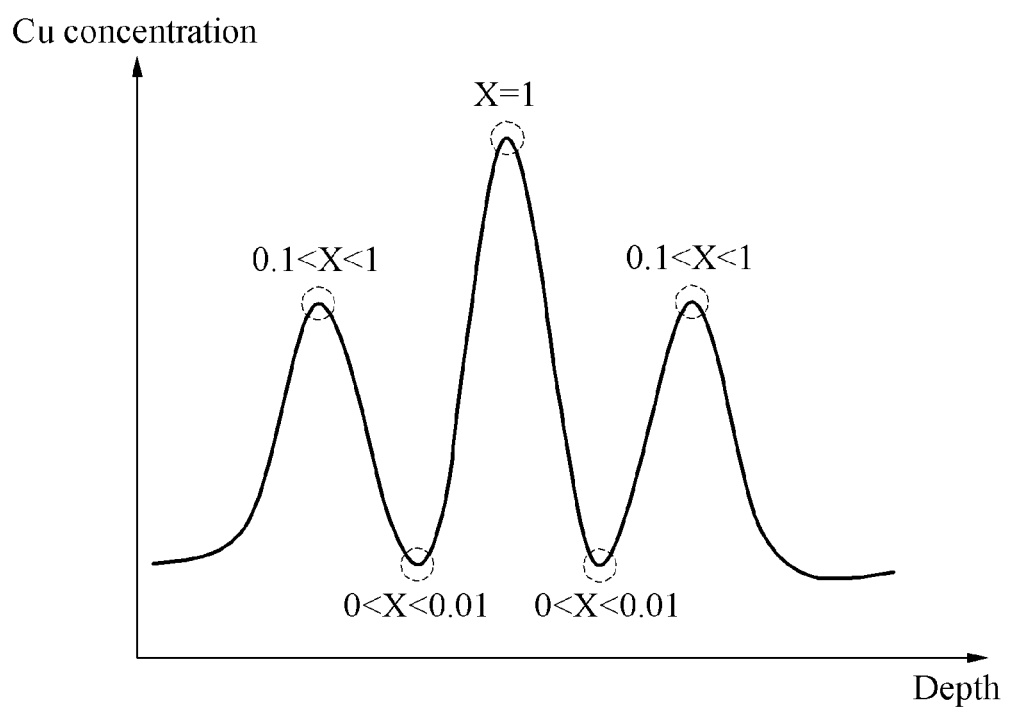

[FIG. 5B]
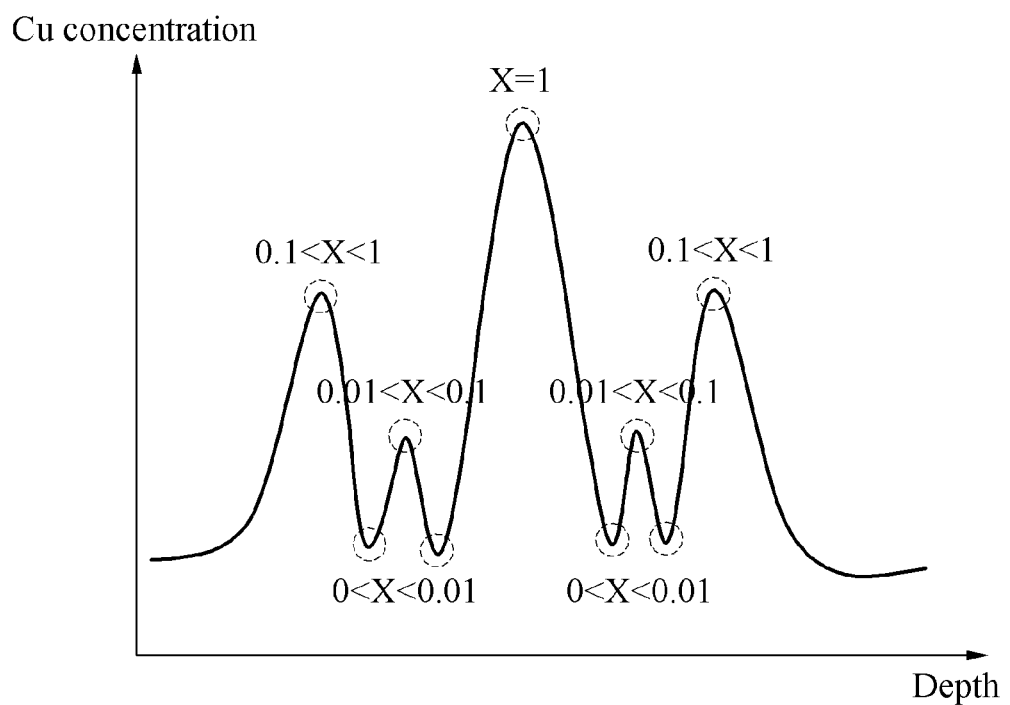

[FIG. 6]
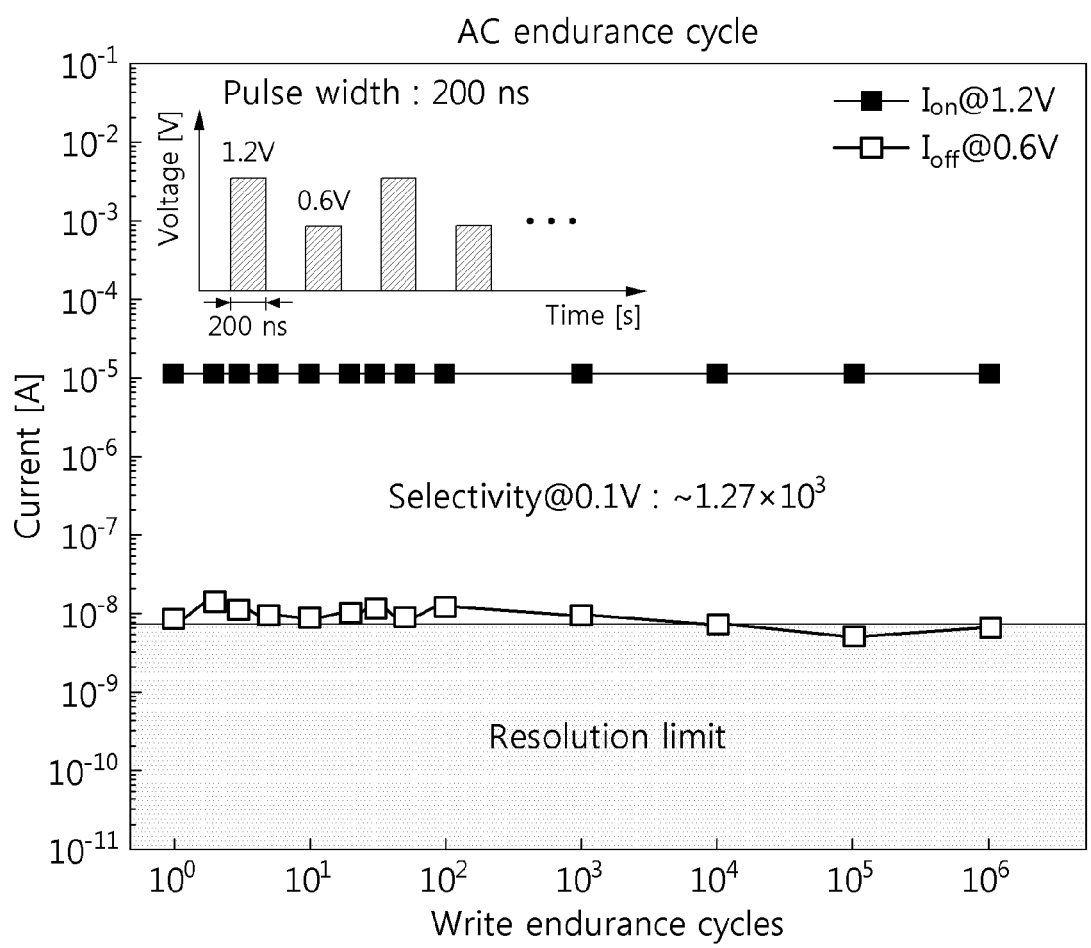

[FIG. 7A]
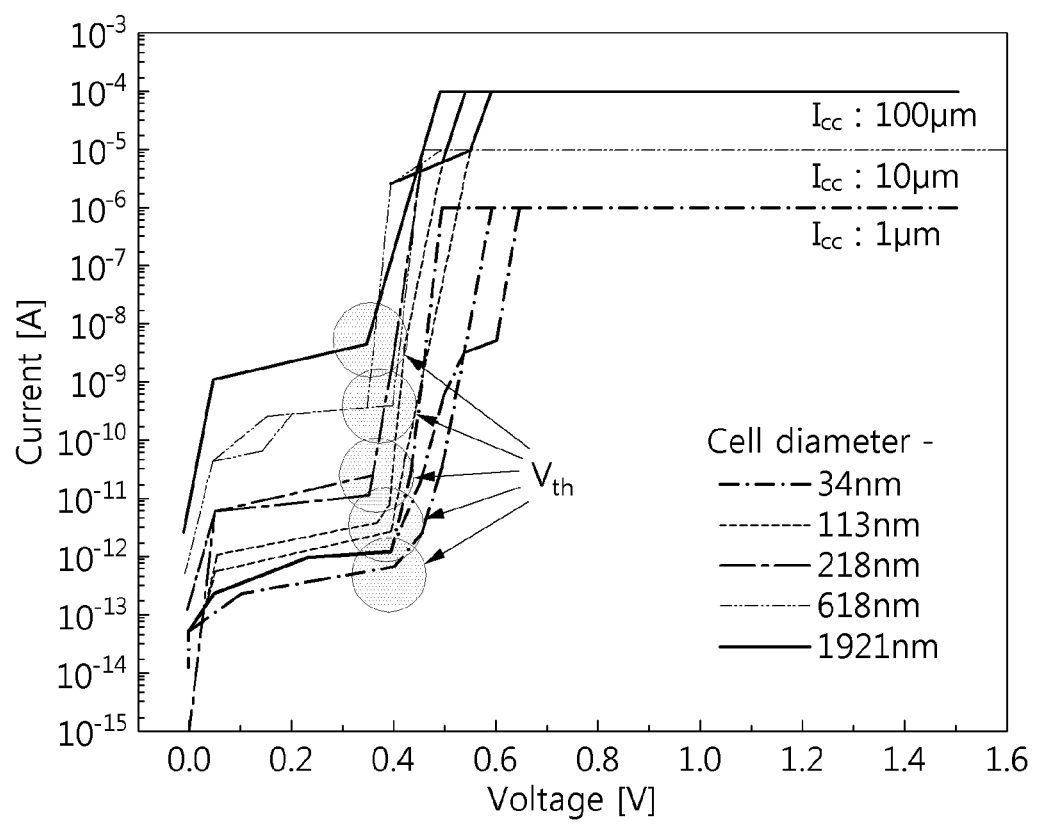

[FIG. 7B]
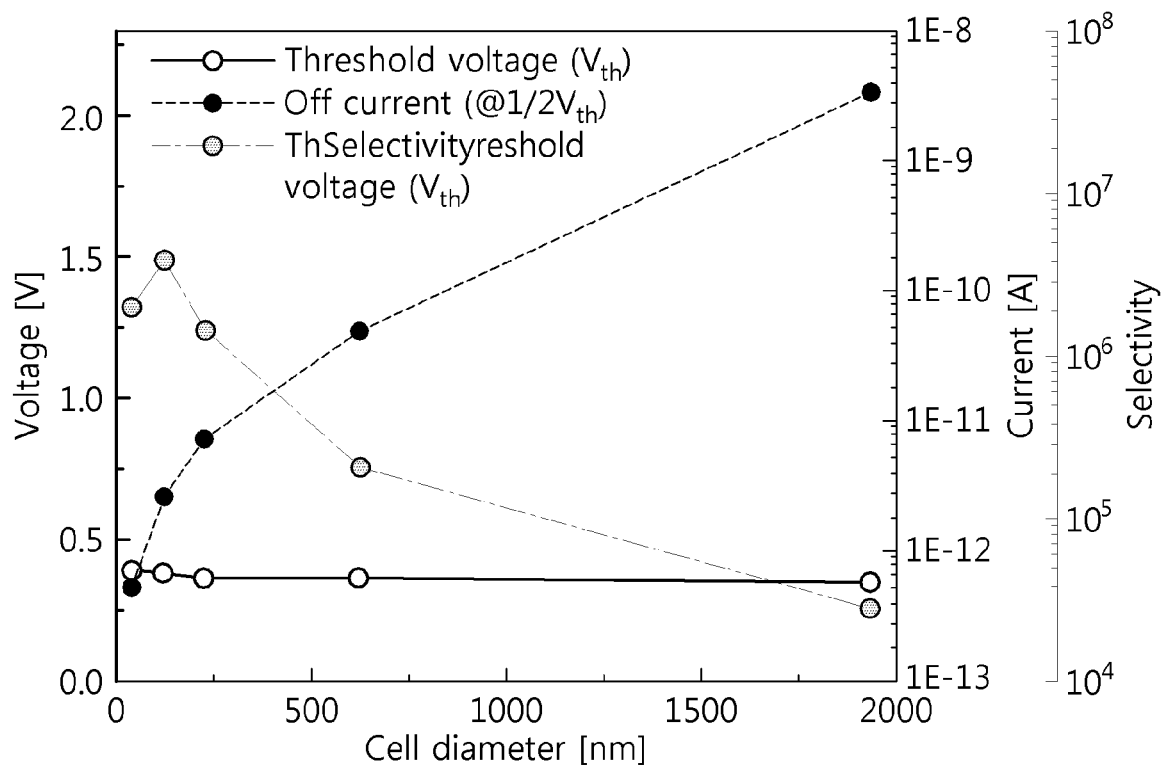

[FIG. 8A]
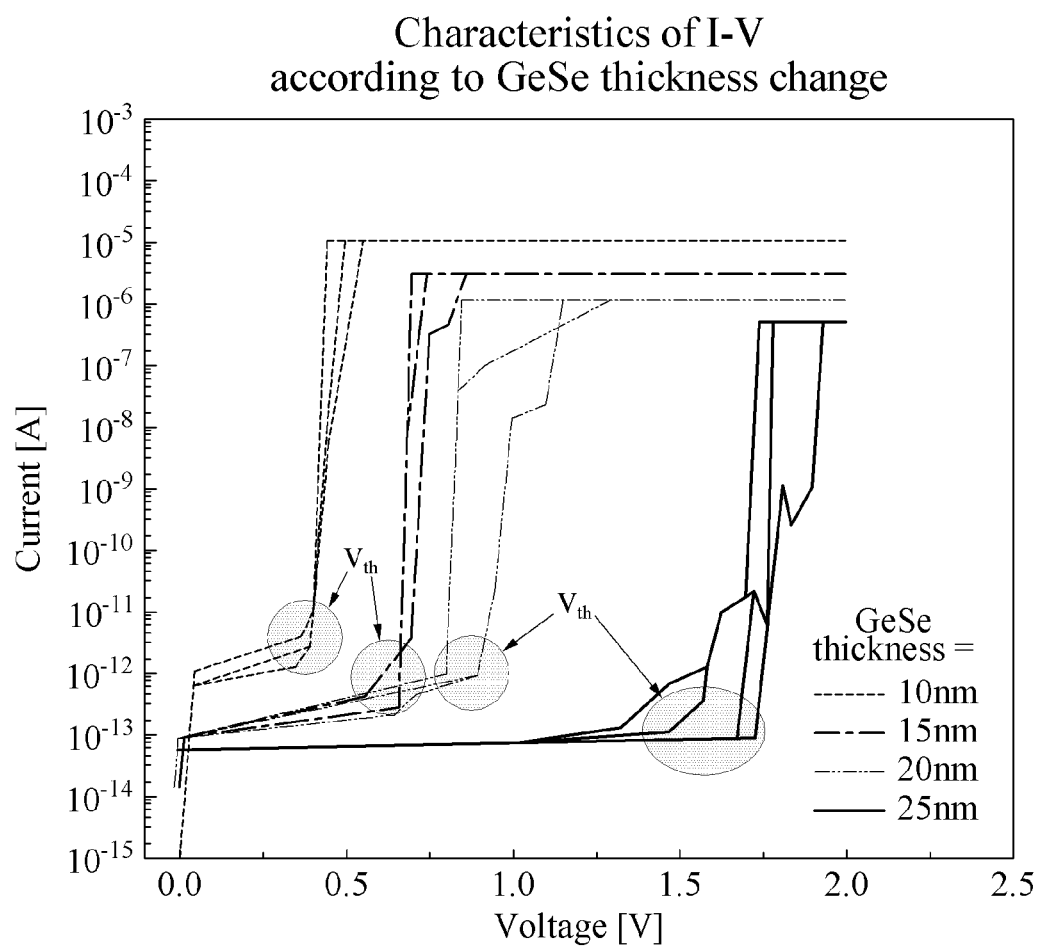

[FIG. 8B]
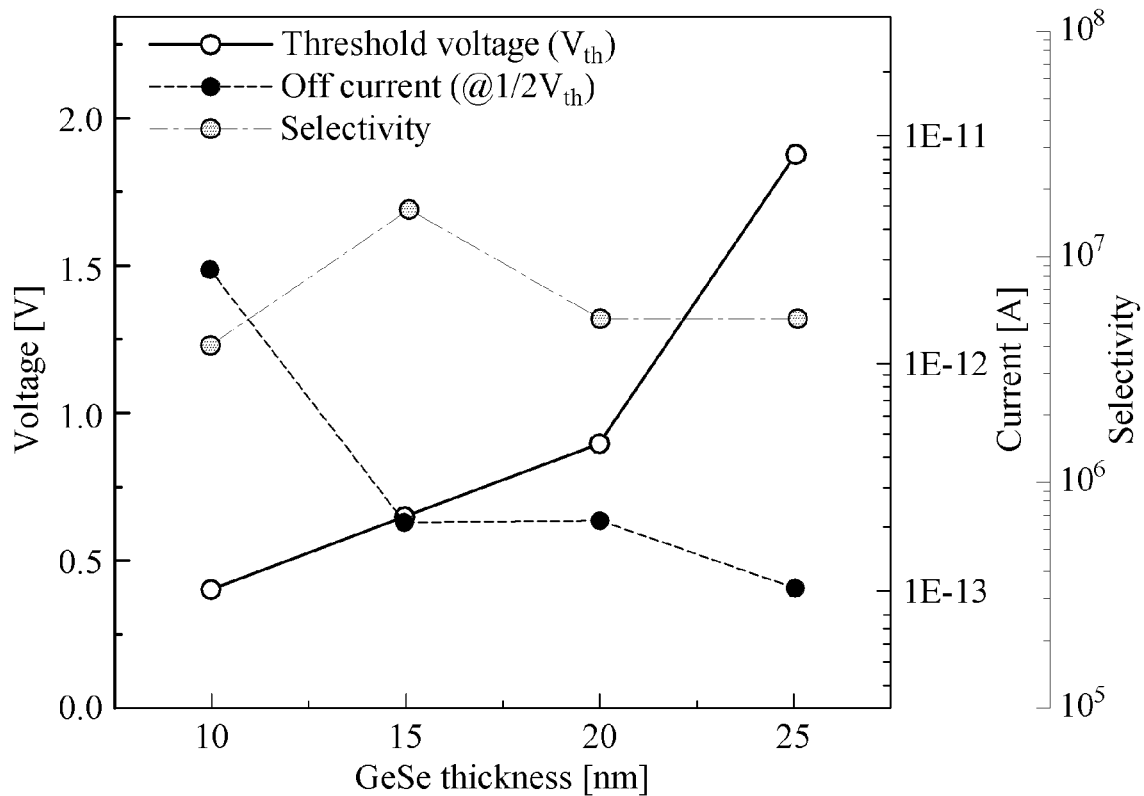

[FIG. 9]
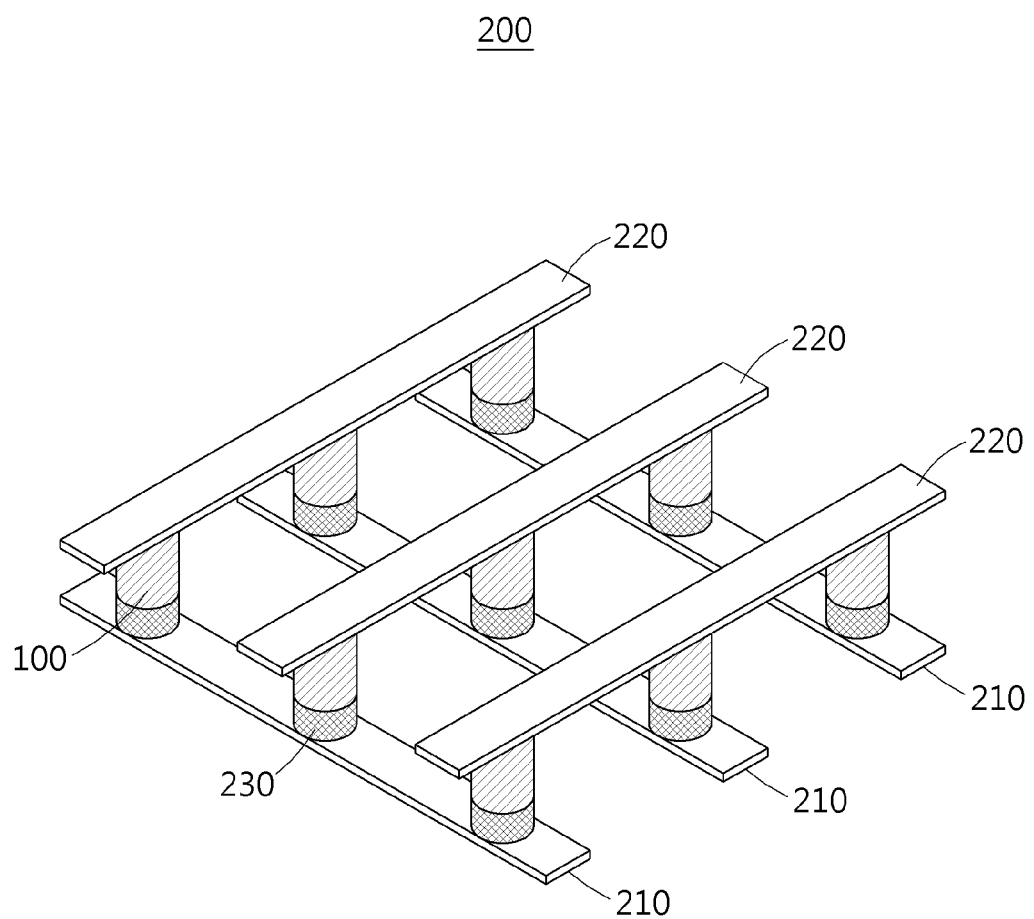

SELECTION DEVICE AND MEMORY DEVICE USING THE SAME

CROSS-REFERENCE TO RELATED APPLICATION

This application is a National Stage Entry of PCT International Application No. PCT/KR2019/015033, which was filed on Nov. 7, 2019, and claims priority to Korean Patent Application No. 10-2018-0165693, filed on Dec. 19, 2018 in the Korean Intellectual Property Office, the disclosure of which is incorporated herein by reference.

TECHNICAL FIELD

The present invention relates to a selection device and a memory device using the same. More particularly, the present invention relates to a selection device having high reliability and a high selection ratio by using difference in the metal concentration profiles of selector layers doped with a metal and a diffusion barrier layer for maintaining the difference in the metal concentration profiles and a memory device using the selection device.

BACKGROUND ART

Until now, semiconductor-related industries have developed successfully based on miniaturization and integration in the 1980s and microminiaturization and high integration in the 1990s.

The key to this success is the fact that even when the size of a device is reduced, the operating principle of the device can be maintained.

Therefore, all research and development has focused on improving existing technology in line with the existing technology method, and so far, such research and development has been very successful.

However, as dependence on information and communication increases, there is a need for a semiconductor device and a system capable of rapidly processing a larger amount of information. To develop such a semiconductor device and such a system, ultra-high speed, ultra-high integration, and ultra-power saving of a memory device, which is a core component, are indispensable.

Accordingly, the necessity of developing an ultra-highly integrated nonvolatile memory device capable of storing a large amount of information is rapidly increasing.

Next-generation nonvolatile memory devices include phase change RAM (PRAM), nano-floating gate memory (NFGM), ReRAM, polymer RAM (PoRAM), magnetic RAM (MRAM), molecular memory, and the like. Development of these next-generation memory devices is focused on implementing all of the high integration and low power consumption of DRAM, the nonvolatile properties of flash memory, and the high-speed operation of SRAM.

To increase the degree of integration of these next-generation nonvolatile memory devices, a cross-point cell array is being developed. However, due to the inherent characteristics of the cross-point cell array, an interference phenomenon occurs due to sneak current between adjacent cells, and an error occurs in a data read operation.

In order to overcome these problems, a method of providing a selection device for each cell has been proposed. However, due to the low selection ratio of the conventional selection device, it is difficult to implement ultra-high integration of a memory device.

DISCLOSURE

Technical Problem

Therefore, the present invention has been made in view of the above problems, and it is one object of the present invention to provide a selection device having a high selection ratio of $10^7$ or more and a high reliability of $10^{12}$ cycles or more and included in a cross-point memory device.

It is another object of the present invention to provide a memory device having high integration without leakage current by applying a selection device having a high selection ratio and high reliability to a cross-point memory device.

Technical Solution

In accordance with one aspect of the present invention, provided is a selection device including a first electrode; a second electrode disposed to face the first electrode; at least one selector layer disposed between the first electrode and the second electrode and including a metal concentration profile; and a diffusion barrier layer disposed between the first electrode, the second electrode, and the at least one selector layer to prevent diffusion of a metal.

The at least one selector layer may have different metal doping concentrations, and thus metal concentration profiles thereof may be different from each other.

The diffusion barrier layer may serve to prevent diffusion of a metal doped in the at least one selector layer into adjacent layers, thereby maintaining difference in metal concentration profiles in the at least one selector layer.

The metal concentration profile may be controlled by adjusting a thickness of the diffusion barrier layer.

Materials forming the first and second electrodes may include at least one selected from platinum (Pt), tungsten (W), titanium nitride (TiN), tantalum nitride (TaN), gold (Au), rubidium (Ru), iridium (Ir), palladium (Pd), titanium (Ti), hafnium (Hf), molybdenum (Mo), and niobium (Nb).

A material forming the selector layer may include at least one selected from chalcogenide materials including germanium sulfide (GeS), germanium selenide (GeSe), germanium telluride (GeTe), silicon sulfide (SiS), silicon selenide (SiSe), silicon telluride (SiTe), zinc sulfide (ZnS), zinc selenide (ZnSe), zinc telluride (ZnTe), antimony sulfide (SbS), antimony selenide (SbSe), and antimony telluride (SbTe); and binary oxide materials including aluminum oxide ($Al_2O_3$), magnesium oxide (MgO), chromium oxide ($Cr_2O_3$), manganese oxide ($MnO_2$), iron oxide ($Fe_2O_3$), cobalt oxide ($CO_3O_4$), nickel oxide (NiO), cerium oxide ($CeO_2$), zirconium oxide ($ZrO_2$), silicon oxide ($SiO_2$), copper oxide (CuO), tantalum oxide ($Ta_2O_5$), titanium oxide ($TiO_2$), zinc oxide (ZnO), hafnium oxide ($HfD_2$), molybdenum oxide ($MoO_2$), indium oxide ($In_2O_3$), tin oxide ($SnO_2$), and tungsten oxide ($W_2O_3$).

The metal of the metal-doped selector layer may include at least one selected from silver (Ag), copper (Cu), nickel (Ni), and titanium (Ti).

The diffusion barrier layer may be formed of at least one selected from titanium nitride (TiN), tantalum nitride (TaN), tungsten nitride (WN), silicon nitride (SiN), aluminum nitride (AlN), and hafnium nitride (HfN).

In accordance with another aspect of the present invention, provided is a memory device including first wires and second wires arranged to cross each other; memory layers disposed at intersections of the first wires and the second wires; and selection devices according to claims 1 to 8 disposed between the memory layers and the first wires or between the memory layers and the second wires.

The memory device may be phase-change RAM (PCRAM), resistive RAM (RRAM), or magnetic RAM.

Advantageous Effects

According to embodiments of the present invention, a selection device having a high selection ratio of $10^7$ or more and a high reliability of $10^{12}$ cycles or more and included in a cross-point memory device can be provided.

According to embodiments of the present invention, by applying a selection device having a high selection ratio and high reliability to a cross-point memory device, a memory device having high integration without leakage current can be provided.

DESCRIPTION OF DRAWINGS

FIG. 1 illustrates a selection device according to one embodiment of the present invention.

FIG. 2 is a graph showing the analysis results of secondary ion mass spectrometry (SIMS) performed on a selection device according to one embodiment of the present invention.

FIG. 3 is an image obtained by overlapping a selection device according to one embodiment of the present invention with a graph showing the analysis results of secondary ion mass spectrometry (SIMS) performed on the copper concentrations for different depths in the selection device.

FIG. 4 is a current-voltage (I-V) graph of a selection device according to one embodiment of the present invention.

FIGS. 5A and 5B are graphs showing change in a copper concentration profile according to change in the thickness of a diffusion barrier layer in a selection device according to one embodiment of the present invention.

FIG. 6 is a graph showing current according to writing and erasing cycles in a selection device according to one embodiment of the present invention.

FIGS. 7A and 7B are graphs showing the threshold voltage, off current, and selection ratio properties of a selection device according to one embodiment of the present invention according to cell diameters in the selection device.

FIGS. 8A and 8B are graphs showing the threshold voltage, off current, and selection ratio properties of a selection device according to one embodiment of the present invention according to change in the thickness of a second selector layer in the selection device.

FIG. 9 illustrates a memory device according to another embodiment of the present invention.

BEST MODE

The present invention will now be described more fully with reference to the accompanying drawings and contents disclosed in the drawings. However, the present invention should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless mentioned otherwise or clearly inferred from context, the expression "x uses a or b" means any one of natural inclusive permutations.

In addition, as used in the description of the disclosure and the appended claims, the singular form "a" or "an" is intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present invention, and it should be understood that the terms are exemplified to describe embodiments of the present invention.

Also, some of the terms used herein may be arbitrarily chosen by the present applicant. In this case, these terms are defined in detail below. Accordingly, the specific terms used herein should be understood based on the unique meanings thereof and the whole context of the present invention.

Meanwhile, terms such as "first" and "second" are used herein merely to describe a variety of constituent elements, but the constituent elements are not limited by the terms. The terms are used only for the purpose of distinguishing one constituent element from another constituent element.

In addition, when an element such as a layer, a film, a region, and a constituent is referred to as being "on" another element, the element can be directly on another element or an intervening element can be present.

Unless defined otherwise, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present invention, and will not be interpreted in an idealized or overly formal sense unless expressly so defined herein.

In addition, in the following description of the present invention, a detailed description of known functions and configurations incorporated herein will be omitted when it may make the subject matter of the present invention unclear. The terms used in the specification are defined in consideration of functions used in the present invention, and can be changed according to the intent or conventionally used methods of clients, operators, and users. Accordingly, definitions of the terms should be understood on the basis of the entire description of the present specification.

Hereinafter, a method of fabricating a multilayered device according to one embodiment of the present invention will be described in detail with reference to the accompanying drawings.

FIG. 1 illustrates a selection device according to one embodiment of the present invention.

Referring to FIG. 1, a selection device 100 according to one embodiment of the present invention has a lamination structure in which a first electrode 110, a first selector layer 130, a diffusion barrier layer 140, a second selector layer 150, the diffusion barrier layer 140, the first selector layer 130, the diffusion barrier layer 140, the second selector layer 150, the diffusion barrier layer 140, the first selector layer 130, the diffusion barrier layer 140, and a second electrode 120 are laminated in sequential order.

In this case, the first selector layer 130 and the second selector layer 150 have metal concentration profiles. The metal concentration profile of the first selector layer 130 and the metal concentration profile of the second selector layer 150 are different from each other, and a profile structure characterized in that the metal concentration of the first selector layer 130 is higher than that of the second selector layer 150 is formed.

In addition, referring to the structure shown in FIG. 1, a total of three layers of the first selector layer 130 and a total of two layers of the second selector layer 150 are formed to be spaced apart from each other, and the metal concentrations of these individual layers may be different from each other.

For example, in the lamination structure of FIG. 1, the first selector layer 130 closer to the first electrode 110 and the first selector layer 130 located in the middle of the lamination structure may have different metal concentrations.

In addition, in the lamination structure of FIG. 1, the second selector layer 150 closer to the first electrode 110 and the second selector layer 150 closer to the second electrode 120 may have different concentrations.

In the selection device 100 according to one embodiment of the present invention, materials forming the first selector layer 130 and the second selector layer 150 may include at least one selected from chalcogenide materials including germanium sulfide (GeS), germanium selenide (GeSe), germanium telluride (GeTe), silicon sulfide (SiS), silicon selenide (SiSe), silicon telluride (SiTe), zinc sulfide (ZnS), zinc selenide (ZnSe), zinc telluride (ZnTe), antimony sulfide (SbS), antimony selenide (SbSe), and antimony telluride (SbTe); and binary oxide materials including aluminum oxide ($Al_2O_3$), magnesium oxide (MgO), chromium oxide ($Cr_2O_3$), manganese oxide ($MnO_2$), iron oxide ($Fe_2O_3$), cobalt oxide ($Co_3O_4$), nickel oxide (NiO), cerium oxide ($CeO_2$), zirconium oxide ($ZrO_2$), silicon oxide ($SiO_2$), copper oxide (CuO), tantalum oxide ($Ta_2O_5$), titanium oxide ($TiO_2$), zinc oxide (ZnO), hafnium oxide ($HfD_2$), molybdenum oxide ($MoO_2$), indium oxide ($In_2O_3$), tin oxide ($SnO_2$), and tungsten oxide ($W_2O_3$).

In addition, the metals of the first selector layer 130 and the second selector layer 150 are formed by injecting metal ions through a doping process, and difference in metal concentration profiles for each selector layer may be implemented according to the degree of doping.

In the selection device 100 according to one embodiment of the present invention, metals formed by doping on the first selector layer 130 and the second selector layer 150 may include at least one selected from silver (Ag), copper (Cu), nickel (Ni), and titanium (Ti).

Referring to FIG. 1, the diffusion barrier layer 140 of the selection device 100 according to one embodiment of the present invention serves to prevent diffusion of metals from the first selector layer 130 adjacent to the upper portion thereof or the second selector layer 150 adjacent to the lower portion thereof, thereby suppressing change in metal concentration profiles caused by diffusion of metals and keeping set profiles constant.

That is, the selection device 100 according to one embodiment of the present invention is characterized in that metal concentration profiles for each layer remain unchanged.

In addition, by adjusting the thickness of the diffusion barrier layer 140, the metal concentration profiles of the selection device 100 according to one embodiment of the present invention may be controlled in detail.

The control of metal concentration profiles according to the thickness of the diffusion barrier layer 140 will be described in more detail with reference to FIGS. 5A and 5B to be described later.

A material forming the diffusion barrier layer 140 of the selection device 100 according to one embodiment of the present invention may include at least one selected from titanium nitride (TiN), tantalum nitride (TaN), tungsten nitride (WN), silicon nitride (SiN), aluminum nitride (AlN), and hafnium nitride (HfN).

In addition, materials forming the first electrode 110 and the second electrode 120 of the selection device 100 according to one embodiment of the present invention may include at least one selected from platinum (Pt), tungsten (W), titanium nitride (TiN), tantalum nitride (TaN), gold (Au), rubidium (Ru), iridium (Ir), palladium (Pd), titanium (Ti), hafnium (Hf), molybdenum (Mo), and niobium (Nb).

In the operation of the selection device 100 according to one embodiment of the present invention, when a voltage is applied to the selection device 100, a copper filament (Cu-filament) is formed ($@V_{th}$) inside the layer of the selection device by the applied voltage. At this time, current is rapidly increased (on-current).

Then, when no voltage is applied, the filament breaks due to diffusion of copper, and current is reduced to the original level (off-current).

That is, the selection device 100 according to one embodiment of the present invention is a device characterized in that a copper filament is formed (on-current) or cut off (off-current) by an applied voltage.

Hereinafter, the detailed structure and detailed characteristics of the selection device 100 according to one embodiment of the present invention will be described in more detail with reference to FIGS. 2 to 8B.

FIG. 2 is a graph showing the analysis results of secondary ion mass spectrometry (SIMS) performed on a selection device according to one embodiment of the present invention.

Referring to FIG. 2, as materials for each layer constituting the selection device, the first electrode 110 is formed of tungsten (W), the second electrode 120 is formed of platinum (Pt), the first selector layer 130 and the second selector layer 150 are formed of germanium selenide (GeSe), the first selector layer 130 and the second selector layer 150 are doped with copper (Cu), and the diffusion barrier layer is formed of titanium nitride (TiN).

FIG. 3 is an image obtained by overlapping a selection device according to one embodiment of the present invention with a graph showing the analysis results of secondary ion mass spectrometry (SIMS) performed on the copper concentrations for different depths in the selection device.

Referring to FIG. 3, in the selection device according to one embodiment of the present invention, in order from the first electrode 110, the copper ions detected per second in the first selector layer 130 are $2.0 \times 10^4$ counts/s, the copper ions detected per second in the second selector layer 150 formed thereon are $3.5 \times 10^3$ counts/s, the copper ions detected per second in the first selector layer 130 formed thereon are $5.0 \times 10^4$ counts/s, the copper ions detected per second in the second selector layer 150 formed thereon are $2.5 \times 10^3$ counts/s, and the copper ions detected per second in the first selector layer 130 formed thereon are $2.0 \times 10^4$ counts/s.

As shown in FIG. 3, the copper concentration profile of the selection device according to one embodiment of the present invention is characterized in that the peak portion formed by the first selector layer 130 having a relatively high copper concentration and the valley portion formed by the second selector layer 150 having a relatively low copper concentration are repeated.

FIG. 4 is a current-voltage (I-V) graph of a selection device according to one embodiment of the present invention.

Referring to FIG. 4, the selection device according to one embodiment of the present invention has a threshold voltage ($V_{th}$) of 0.65 V and exhibits the characteristics of a field-assisted superlinear threshold (FAST) selection device having a selection ratio of $1.9 \times 10^7$.

Accordingly, a selection device having high reliability and high selection ratio may be provided.

FIGS. 5A and 5B are graphs showing change in a copper concentration profile according to change in the thickness of a diffusion barrier layer in a selection device according to one embodiment of the present invention.

More specifically, referring to FIGS. 5A and 5B, in the selection devices having the same lamination structure, a copper concentration profile when a diffusion barrier layer formed of titanium nitride (TiN) is formed to have a thickness of 20 nm to 100 nm (FIG. 5A) and a copper concentration profile when a diffusion barrier layer formed of titanium nitride (TiN) is formed to have a thickness of 0 nm to 20 nm (FIG. 5B) are compared.

Referring to FIG. 5A, it can be confirmed that the peak points in the copper concentration coincide with the positions where the first selector layers are formed.

On the other hand, referring to FIG. 5B, it can be confirmed that the peak points in the copper concentration coincide with the positions where the first and second selector layers are formed.

That is, in FIG. 5A, the copper concentration profile has three peaks. In FIG. 5B, the copper concentration profile has five peaks. This difference is due to diffusion of some copper into an adjacent selector layer when the thickness of the diffusion barrier layer is less than 20 nm.

By performing control in this way, a desired copper concentration profile may be achieved.

FIG. 6 is a graph showing current according to writing and erasing cycles in a selection device according to one embodiment of the present invention.

Referring to FIG. 6, in the selection device according to one embodiment of the present invention, current per cycle at the "on" voltage of 1.2 V and current per cycle at the "off" voltage of 0.6 V do not decrease and remain constant.

In addition, due to limitation of the resolution of measurement equipment when measuring off current, the selection ratio at a voltage of 0.1 V is $1.27 \times 10^3$ rather than $10^7$ or more.

Based on these results, it can be seen that the selection device according to one embodiment of the present invention has a long lifespan.

FIGS. 7A and 7B are graphs showing the threshold voltage, off current, and selection ratio properties of a selection device according to one embodiment of the present invention according to cell diameters in the selection device.

FIG. 7A is a current-voltage graph according to cell diameters, and FIG. 7B is a graph showing data obtained by plotting the threshold voltage, off current, and selection ratio of the current-voltage graph.

Cell diameters were measured using devices having diameters of 34 nm, 113 nm, 218 nm, 618 nm, and 1,921 nm, respectively, and the devices all have a threshold voltage of about 0.4 V regardless of cell diameters.

As a cell diameter increases in the order of 34 nm, 113 nm, 218 nm, 618 nm, and 1,921 nm, off current values of $5 \times 10^{-13}$ A, $2.6 \times 10^{-12}$ A, $6.9 \times 10^{-12}$ A, $4.8 \times 10^{-11}$ A, and $3.5 \times 10^{-9}$ A are observed, indicating that the off current value increases in proportion to the cell area.

In addition, as a cell diameter increases in the order of 34 nm, 113 nm, 218 nm, 618 nm, and 1,921 nm, selection ratios of $2.0 \times 10^6$, $3.9 \times 10^6$, $1.5 \times 10^6$, $2.1 \times 10^5$, and $2.8 \times 10^4$ are observed.

FIGS. 8A and 8B are graphs showing the threshold voltage, off current, and selection ratio properties of a selection device according to one embodiment of the present invention according to change in the thickness of a second selector layer in the selection device.

FIG. 8A is a current-voltage graph according to the thickness of the second selector layer, and FIG. 8B is a graph showing data obtained by plotting the threshold voltage, off current, and selection ratio of the current-voltage graph.

The thickness of the second selector layer was measured using devices having diameters of 5 nm, 10 nm, 15 nm, 20 nm, and 25 nm, respectively, and the device having a thickness of 5 nm did not exhibit the characteristics of a selection device.

As the thickness of the second selector layer increases in the order of 10 nm, 15 nm, 20 nm, and 25 nm, a threshold voltage increases in the order of 0.4 V, 0.65 V, 0.9 V, and 1.88 V, and an off current value decreases in the order of $2.6 \times 10^{-12}$ A, $2.0 \times 10^{-13}$ A, $2.0 \times 10^{-13}$ A, and $1.0 \times 10^{-13}$ A.

In addition, as the thickness of the second selector layer increases in the order of 10 nm, 15 nm, 20 nm, and 25 nm, selection ratios of $3.9 \times 10^6$, $1.5 \times 10^7$, $5.0 \times 10^6$, and $5.0 \times 10^6$ are observed.

As a result, it can be confirmed that, when the thickness of the second selector layer is 15 nm, a maximum value of selection ratio is observed.

FIG. 9 illustrates a memory device according to another embodiment of the present invention.

Referring to FIG. 9, a memory device 200 according to another embodiment of the present invention includes first wires 210 and second wires 220 arranged to cross each other, memory layers 230 disposed at intersections of the first wires 210 and the second wires 220, and the selection devices 100 disposed between the memory layers 230 and the first wires 210 or between the memory layers 230 and the second wires 220.

In this case, the selection device 100 is the selection device 100 according to one embodiment of the present invention described above.

In addition, the memory layers 230 may be phase change layers, resistance change layers, or magnetoresistance layers. Accordingly, the memory device 200 according to another embodiment of the present invention may be phase-change RAM (PCRAM), resistive RAM (RRAM), or magnetic RAM.

As described above, when the selection device 100 according to one embodiment of the present invention is applied to the memory device 200 according to another embodiment of the present invention, due to the high selection ratio of $10^7$ or more and the high reliability of $10^{12}$ cycles or more, which are the characteristics of the selection device 100 according to one embodiment of the present invention, a memory device having excellent characteristics may be fabricated.

Meanwhile, embodiments of the present invention disclosed in the present specification and drawings are only provided to aid in understanding of the present invention and the present invention is not limited to the embodiments. It will be apparent to those skilled in the art that various modifications can be made to the above-described exemplary embodiments of the present invention without departing from the spirit and scope of the invention.

The invention claimed is:

1. A selection device, comprising:
    a first electrode;
    a second electrode disposed to face the first electrode;
    a selector layer comprising at least three first selector layers and at least two second selector layers disposed between the first electrode and the second electrode and comprising a metal concentration profile; and
    a diffusion barrier to prevent diffusion of a metal doped in the selector layer,
    wherein the metal concentration profile comprises a metal concentration of a metal doped in the at least three first selector layers higher than a metal concentration of a metal doped in the at least two second selector layer,
    wherein the diffusion barrier layer is disposed between the second electrode and the one of the at least three first selector layers, and is disposed between the one of the at least three first selector layers and the one of the at least two second selector layers, to separate the one of the at least three first selector layers from the one of the at least two second selector layers, and controls changes in the metal concentration profile that may occur during diffusion of the metal and maintains the metal concentration profile constant,
    wherein the metal concentration for one of the at least three first selector layer adjacent to the first electrode is different from the one of the at least three first selector layer disposed between the first electrode and the second electrode, and
    wherein the metal concentration for one of the at least two second selector layer adjacent to the first electrode is different from the one of the at least two second selector layer adjacent to the second electrode.

2. The selection device according to claim 1, wherein the metal concentration profile is controlled by adjusting a thickness of the diffusion barrier layer.

3. The selection device according to claim 1, wherein materials forming the first and second electrodes comprise at least one selected from platinum (Pt), tungsten (W), titanium nitride (TiN), tantalum nitride (TaN), gold (Au), rubidium (Ru), iridium (Ir), palladium (Pd), titanium (Ti), hafnium (Hf), molybdenum (Mo), and niobium (Nb).

4. The selection device according to claim 1, wherein a material forming the selector layer comprises at least one selected from chalcogenide materials comprising germanium sulfide (GeS), germanium selenide (GeSe), germanium telluride (GeTe), silicon sulfide (SiS), silicon selenide (SiSe), silicon telluride (SiTe), zinc sulfide (ZnS), zinc selenide (ZnSe), zinc telluride (ZnTe), antimony sulfide (SbS), antimony selenide (SbSe), and antimony telluride (SbTe); and binary oxide materials comprising aluminum oxide ($Al_2O_3$), magnesium oxide (MgO), chromium oxide ($Cr_2O_3$), manganese oxide ($MnO_2$), iron oxide ($Fe_2O_3$), cobalt oxide ($Co_3O_4$), nickel oxide (NiO), cerium oxide ($CeO_2$), zirconium oxide ($ZrO_2$), silicon oxide ($SiO_2$), copper oxide (CuO), tantalum oxide ($Ta_2O_5$), titanium oxide ($TiO_2$), zinc oxide (ZnO), hafnium oxide ($HfO_2$), molybdenum oxide ($MoO_2$), indium oxide ($In_2O_3$), tin oxide ($SnO_2$), and tungsten oxide ($W_2O_3$).

5. The selection device according to claim 1, wherein the metal doped in the at least three first selector layers and the at least two second selector layers comprises at least one selected from silver (Ag), copper (Cu), nickel (Ni), and titanium (Ti).

6. The selection device according to claim 1, wherein the diffusion barrier layer is formed of at least one selected from titanium nitride (TiN), tantalum nitride (TaN), tungsten nitride (WN), silicon nitride (SiN), aluminum nitride (AlN), and hafnium nitride (HfN).

7. A memory device, comprising:
    first wires and second wires arranged to cross each other;
    memory layers disposed at intersections of the first wires and the second wires; and
    selection devices according to claim 1 disposed between the memory layers and the first wires or between the memory layers and the second wires.

8. The memory device according to claim 7, wherein the memory device is phase-change RAM (PCRAM), resistive RAM (RRAM), or magnetic RAM.

* * * * *